(12) United States Patent
Venkata

(10) Patent No.: US 11,442,872 B2
(45) Date of Patent: Sep. 13, 2022

(54) MEMORY REFRESH OPERATIONS USING REDUCED POWER

(71) Applicant: Micron Technology, Inc., Boise, ID (US)

(72) Inventor: Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 555 days.

(21) Appl. No.: 16/545,949

(22) Filed: Aug. 20, 2019

(65) Prior Publication Data
US 2021/0056045 A1 Feb. 25, 2021

(51) Int. Cl.
| | |
|---|---|
| G06F 12/14 | (2006.01) |
| G11C 11/406 | (2006.01) |
| G11C 11/4074 | (2006.01) |
| G06F 13/16 | (2006.01) |
| G11C 11/409 | (2006.01) |

(52) U.S. Cl.
CPC ...... *G06F 12/1408* (2013.01); *G06F 13/1673* (2013.01); *G11C 11/409* (2013.01); *G11C 11/4074* (2013.01); *G11C 11/40618* (2013.01)

(58) Field of Classification Search
None
See application file for complete search history.

(56) References Cited

U.S. PATENT DOCUMENTS

| | | | |
|---|---|---|---|
| 2005/0047239 A1* | 3/2005 | Takahashi | G11C 11/40603 365/222 |
| 2013/0254475 A1* | 9/2013 | Perego | G11C 11/406 711/106 |
| 2021/0056045 A1* | 2/2021 | Venkata | G06F 13/1673 |

* cited by examiner

*Primary Examiner* — James G Norman
(74) *Attorney, Agent, or Firm* — Fletcher Yoder, P.C.

(57) ABSTRACT

Techniques described herein are related to protecting at least a portion of data stored in a memory array. A method may include detecting an invalid memory access request based at least in part on the secret key and the identifier and preventing unauthorized access of a memory array by halting an internal refresh of one or more memory cells associated with the memory array in response to detecting the invalid memory access request.

20 Claims, 4 Drawing Sheets

MEMORY REFRESH OPERATIONS USING REDUCED POWER

BACKGROUND

The present disclosure relates generally to memory devices and, more particularly, to memory refresh operations for preserving data stored in the memory devices.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system includes processing circuitry, such as one or more processors or other suitable components, and memory devices, such as chips or integrated circuits. One or more memory devices may be implemented on a memory module as part of a memory array, such as a dynamic random-access memory (DRAM) device employed on a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for the operation. In addition, in some cases, data output from the operation may be stored in memory, for example, to enable subsequent retrieval. These memory devices may include storage circuity that is to be periodically refreshed via memory refresh operations (e.g., refreshing operations) to maintain data stored via the memory devices. However, the refresh operations may consume undesired amounts of power.

BRIEF DESCRIPTION OF THE DRAWINGS

Various aspects of this disclosure may better be understood upon reading the following detailed description and upon reference to the drawings in which.

DETAILED DESCRIPTION

Figure 1:
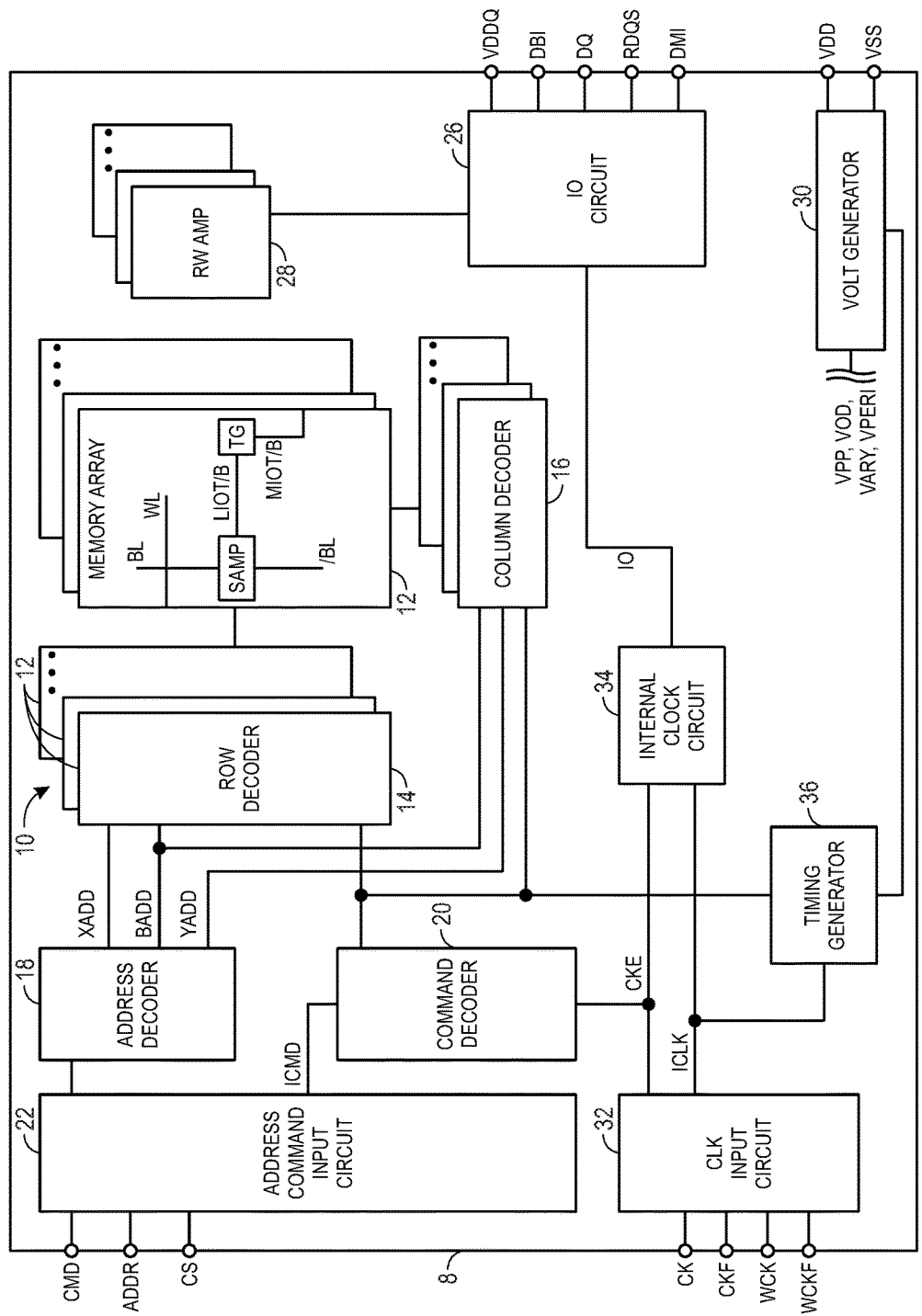
FIG. 1 is a block diagram of a system including a system on chip (SOC) that may access a memory bank, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor. Different types of memory, however, may be periodically or occasionally refreshed to suitably retain information within the memory.

For example, dynamic random-access memory (DRAM) device, or another type of volatile semiconductor memory device, may lose information stored within its memory circuitry overtime. To counteract degradation over time, the DRAM device may be refreshed as part of a memory refresh operation. During the memory refresh operation, portions of the DRAM device are read and rewritten as a way to refresh (e.g., restore) electrical signals representing the information stored within the memory circuitry.

Like many operations within an electronic device, a memory refresh operation may be initiated by a controller of the electronic device and managed by subsequent logic circuitry that generates additional control signal(s) in response to an initiation of the memory refresh operation. The memory devices may include memory banks, and groups of memory banks may couple to memory bank logic circuitry that generate the additional control signal(s) to perform the memory refresh operation. Based on the particular configuration of the electronic device and the DRAM devices of the electronic device, the memory bank logic circuitry may generate unintentionally redundant refresh control signals.

For example, a subset of the memory bank logic circuitry may generate equivalent memory refresh control signals for different portions of the DRAM. Since at least two memory bank logic circuitries may generate these equivalent memory refresh control signals, the unintentionally redundant refresh control signals may be generated. Power consumption of the DRAM device, and thus of the electronic device, may be reduced if these redundant refresh control signals were shared between portions of the DRAM. For example, memory bank logic circuitry may be shared between the portions of the DRAM such that at least one memory refresh control signal is shared between memory banks of the DRAM to complete the memory refresh operation.

Keeping the forgoing in mind, FIG. 1 is a block diagram of an electronic device (e.g., a semiconductor memory device, such as a dynamic random-access memory (DRAM) device). The electronic device may include an array of memory cells, such as memory array 10. The memory array 10 may include memory banks 12 that includes one or more memory cells. Each of the memory banks 12 may include word lines (WL), bit lines (BL), and memory cells arranged at intersections of word lines and the bit lines. Memory cells may include any one of a number of different memory media types, including capacitive, magnetoresistive, ferroelectric, phase change, or the like. The selection of a word line may be performed by a row decoder 14, and the selection of a bit line may be performed by a column decoder 16. Sense amplifiers (SAMP) may be provided for corresponding bit lines and connected to at least one respective local input/output (I/O) line pair (LIOT/B), which may be coupled to at least a respective one main I/O line pair (MIOT/B), via transfer gates (TG), which may operate as switches. The memory array 10 may also include plate lines and corresponding circuitry for managing their operation.

The memory array 10 may use external terminals that include command and address terminals coupled to a command bus and an address bus to receive command signals (CMD) and address signals (ADDR), respectively. The memory array 10 may further include a chip select terminal to receive a chip select signal (CS), clock terminals to receive clock signals (CK and CKF), data clock terminals to receive data clock signals (WCK and WCKF), data terminals (DQ, RDQS, DBI, and DMI), and power supply terminals (VDD, VSS, VDDQ, and VSSQ).

The command terminals and address terminals may be supplied with an address signal and a bank address signal from outside. The address signal and the bank address signal supplied to the address terminals may be transferred, via a command address input circuit 22, to an address decoder 18. The address decoder 18 may receive the address signals and supply a decoded row address signal (XADD) to the row decoder 14, and a decoded column address signal (YADD) to the column decoder 16. The address decoder 18 may also receive the bank address signal (BADD) and supply the bank address signal to both the row decoder 14 and the column decoder 16.

The command and address terminals may be supplied with command signals (CMD), address signals (ADDR), and chip select signals (CS), from a memory controller. The command signals may represent various memory commands from the memory controller (e.g., including access commands, which may include read and/or write commands). The chip select signal (CS) may be used to select the memory array 10 to respond to commands and address provided to the command and address terminals. When an active chip select signal (CS) is provided to the memory array 10, the command signals (CMD) and address signals (ADDR) may be decoded and memory operations may be performed. The command signals (CMD) may be provided as internal command signals (ICMD) to a command decoder 20 via a command address input circuit 22. The command decoder 20 may include circuits to decode the internal command signals to generate various internal signals and commands for performing memory operations, such as a row command signal to select a word line and a column command signal to select a bit line. The internal command signals (ICMD) may also include output and input activation commands, such as clocked command (CMDCK). The command decoder 20 may further include one or more registers for tracking various counts or values (e.g., counts of refresh commands received by the memory array 10 and/or self-refresh operations performed by the memory array 10).

When a read command is issued and a row address and a column address are timely supplied with the read command, the read data may be read from memory cells in the memory array 10 designated by the row address and column address. The read command may be received by the command decoder 20, which may provide internal commands to the I/O circuit 26 so that read data may be output from the data terminals via read/write amplifiers 28 and the I/O circuit 26 according to the clock signals. The read data may be provided at a time defined by read latency information (RL) that may be programmed in the memory array 10, such as in a mode register (not shown in FIG. 1). The read latency information may be defined in terms of clock cycles of the clock signal (CK). For example, the read latency information may be a number of clock cycles of the clock signal (e.g., CK) after the read command is received by the memory array 10 when the associated read data is provided.

When a write command is issued and a row address and a column address are timely supplied with the write command, write data may be supplied to the data terminals according to the clock signals (e.g., WCK and WCKF). The write command may be received by the command decoder 20, which may provide internal commands to the I/O circuit 26 so that the write data is received by data receivers in the I/O circuit 26, and supplied via the I/O circuit 26 and the read/write amplifiers 28 to the memory array 10. The write data may be written in the memory cell designated by the row address and the column address. The write data may be provided to the data terminals at a time that is defined by write latency (WL) information. The write latency information may be programmed in the memory array 10, such as in the mode register (not shown in FIG. 1). The write latency information may be defined in terms of clock cycles of the clock signal (CK). For example, the write latency information may be a number of clock cycles of the clock signal (CK) after the write command is received by the memory array 10 when the associated write data is received.

The power supply terminals may be supplied with power supply potentials (VDD and VSS). These power supply potentials (VDD and VSS) may be supplied to an internal voltage generator circuit 30. The internal voltage generator circuit 30 may generate various internal potentials (VPP, VOD, VARY, VPERI, and the like) based on the power supply potentials (VDD and VSS). The internal potential (VPP) may be used in the row decoder 14, the internal potentials (VOD and VARY) may be used in the sense amplifiers included in the memory array 10, and the internal potential (VPERI) may be used in many other circuit blocks.

The power supply terminal may also be supplied with a power supply potential (VDDQ). The power supply potential (VDDQ) may be supplied to the I/O circuit 26 together with the power supply potential (VSS). The power supply potential (VDDQ) may be the same potential as the power supply potential (VDD) in an embodiment of the present technology. The power supply potential (VDDQ) may be a different potential from the power supply potential (VDD) in another embodiment of the present technology. However, the dedicated power supply potential (VDDQ) may be used for the I/O circuit 26 so that power supply noise generated by the I/O circuit 26 does not propagate to the other circuit blocks.

The clock terminals and data clock terminals may be supplied with external clock signals and complementary external clock signals. The external clock signals (CK, CKF, WCK, and WCKF) may be supplied to a clock input circuit 32. Some clock signals (CK and CKF, WCK and WCK) may be complementary. Complementary clock signals may have opposite clock levels and transition between the opposite clock levels at the same time. For example, when a clock signal is at a low clock level, a complementary clock signal is at a high level, and when the clock signal is at a high clock level, the complementary clock signal is at a low clock level. Moreover, when the clock signal transitions from the low clock level to the high clock level, the complementary clock signal transitions from the high clock level to the low clock level, and when the clock signal transitions from the high clock level to the low clock level, the complementary clock signal transitions from the low clock level to the high clock level.

Input buffers included in the clock input circuit 32 may receive the external clock signals. For example, when enabled by a signal (CKE) from the command decoder 20, an input buffer may receive the clock signals (CK, CKF, WCK, and WCKF). The clock input circuit 32 may receive the external clock signals to generate internal clock signals (ICLK). The internal clock signals may be supplied to an internal clock circuit 34. The internal clock circuit 34 may provide various phase and frequency controlled internal clock signals based on the received internal clock signals and a clock enable signal (CKE) from the command address input circuit 22. For example, the internal clock circuit 34 may include a clock path (not shown in FIG. 1) that receives the internal clock signals and provides various clock signals to the command decoder 20. The internal clock circuit 34 may further provide input/output (I/O) clock signals. The I/O clock signals used as a timing signal may be supplied to the I/O circuit 26 for determining an output timing of read data and the input timing of write data. The I/O clock signals may be provided at multiple clock frequencies so that data may be output from and/or input to the memory array 10 at different data rates. A higher clock frequency may be desirable when high memory speed is desired. A lower clock frequency may be desirable when lower power consumption is desired. The internal clock signals may also be supplied to a timing generator 36 and used to generate various internal clock signals.

The memory array 10 may couple to any suitable electronic device that uses at least a portion of memory for temporary and/or persistent storage of information as a host device. For example, the host device may include a desktop or portable computer, a server, a hand-held device (e.g., a mobile phone, a tablet, a digital reader, a digital media player), or at least a portion of processing circuitry, such as a central processing unit, a co-processor, a dedicated memory controller, or the like. The host device may sometimes be a networking device (e.g., a switch, a router) or a recorder of digital images, audio and/or video, a vehicle, an appliance, a toy, or any one of a number of other products. In one embodiment, the host device may be connected directly to memory array 10, although in other embodiments, the host device may be indirectly connected to the memory array 10 (e.g., over a networked connection or via communication with intermediary devices).

Figure 2:
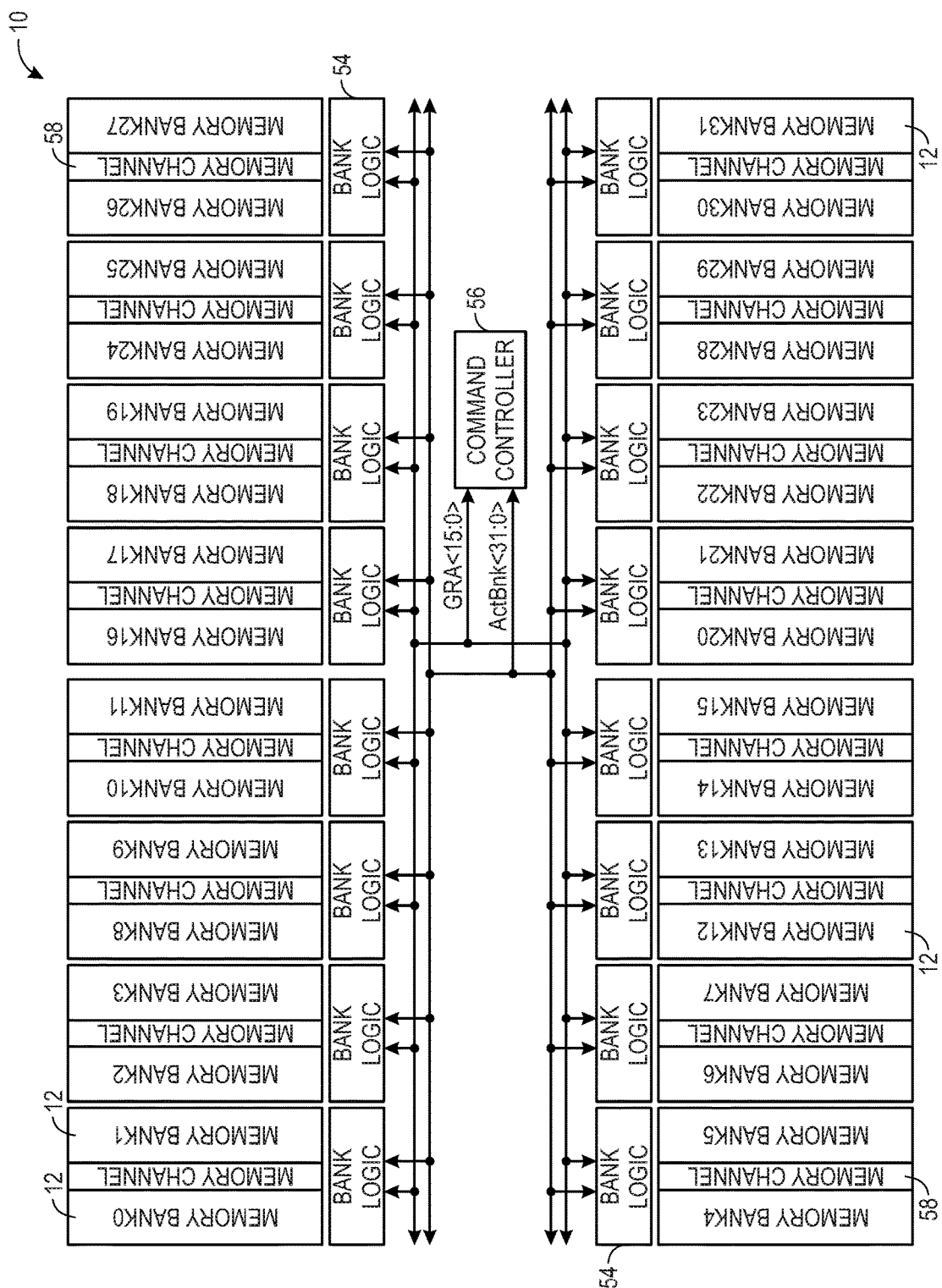
FIG. 2 is a block diagram of a memory array of the system of FIG. 1, in accordance with an embodiment.

As described above, the memory array 10 may include a number of memory banks 12. FIG. 2 is a block diagram of the memory array 10 with memory banks 12. One or more memory banks 12 may operably couple to bank logic circuitry 54. In this example, the memory array 10 includes 32 memory banks 12, however it is noted that any suitable number of memory banks 12 may be included within the memory array 10. When a refresh operation is to occur, the bank logic circuitry 54 receives at least one refresh control signal from a command controller 56. The command controller 56 may be control or processing circuitry coupled between a memory controller and the memory banks 12. The command controller 56 may initiate a refresh operation on a scheduled basis and/or in response to a sensed operating condition of the system 8. For example, memory may be refreshed at regular or defined time intervals to prevent information decay and/or in response to sensing operating conditions that may compromise an information-retaining ability of one or more materials of the memory.

The command controller 56 may transmit Global Row Address (GRA<15:0>) signals and Activate Bank (ActBnk<31:0>) signals. The Global Row Address (GRA<15:0>) signals and the Activate Bank (ActBnk<31:0>) signals may enable the command controller 56 to refresh each row of each of the memory banks 12 via incrementing through addresses for each row of the memory banks 12. It is noted that each memory bank 12 may have a same number of rows, and the number of rows may be greater than or less than sixteen rows.

A memory channel 58 may be disposed between the memory banks 12. The memory channel 58 may include communicative couplings used during memory operations, such as when individually activating or deactivating rows of the memory banks 12 during the refresh operations and/or when distributing refresh operation signals (e.g., Global Row Address (GRA<15:0>) signals, Activate Bank (ActBnk<31:0>) signals). In this way, the memory channel 58 may include one or more hardwired couplings between respective of the memory banks 12.

Figure 3:
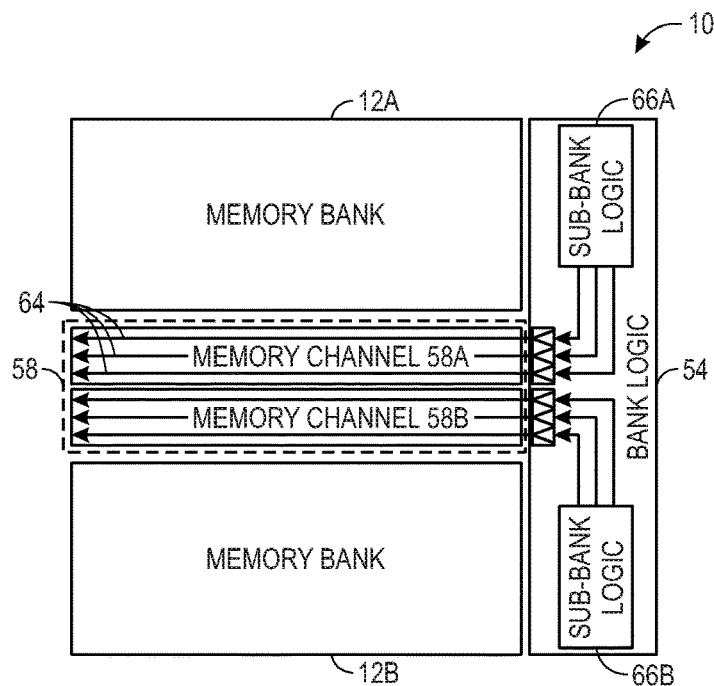
FIG. 3 is a block diagram of a pair of memory banks of the memory array of FIG. 1, in accordance with an embodiment.

To help describe the memory channel 58 and the memory banks 12, FIG. 3 is a block diagram of a pair of the memory banks 12 (12A, 12B) of the memory array 10. Disposed between the memory banks 12 is the memory channel 58 (58A, 58B). Each of the memory channels 58 may include one or more sub-channels 64 coupling outputs from sub-bank logic circuitry 66 (66A, 66B) to the rows and/or columns of the corresponding memory bank 12. The sub-bank logic circuitry 66 may include circuitry that generates refresh control signals in response to control signals from the command controller 56. The refresh control signals may be individually generated or suitably distributed via the memory channels 58 to facilitate row-by-row or column-by-column refreshing operations.

In some cases, the refresh operations involve generating refresh control signals for each memory bank 12 at a substantially similar time. For example, the memory bank 12A may receive refresh control signals at a same time as the memory bank 12B. In these cases, the refresh control signals for each pair of memory banks 12A, 12B may be identical and/or at least be similar for a portion of the refresh control signal. Thus, an undesirable amount of power may be consumed by the system 8 when generating and dispersing the refresh control signals since the system 8 generates repeated signals. As described herein, power consumption by the memory banks 12, and thus the system 8, may be reduced if circuitry were included to permit the sharing of the refresh control signals between the pair of memory banks 12 (e.g., the pair of memory banks 12A, 12B).

Figure 4:
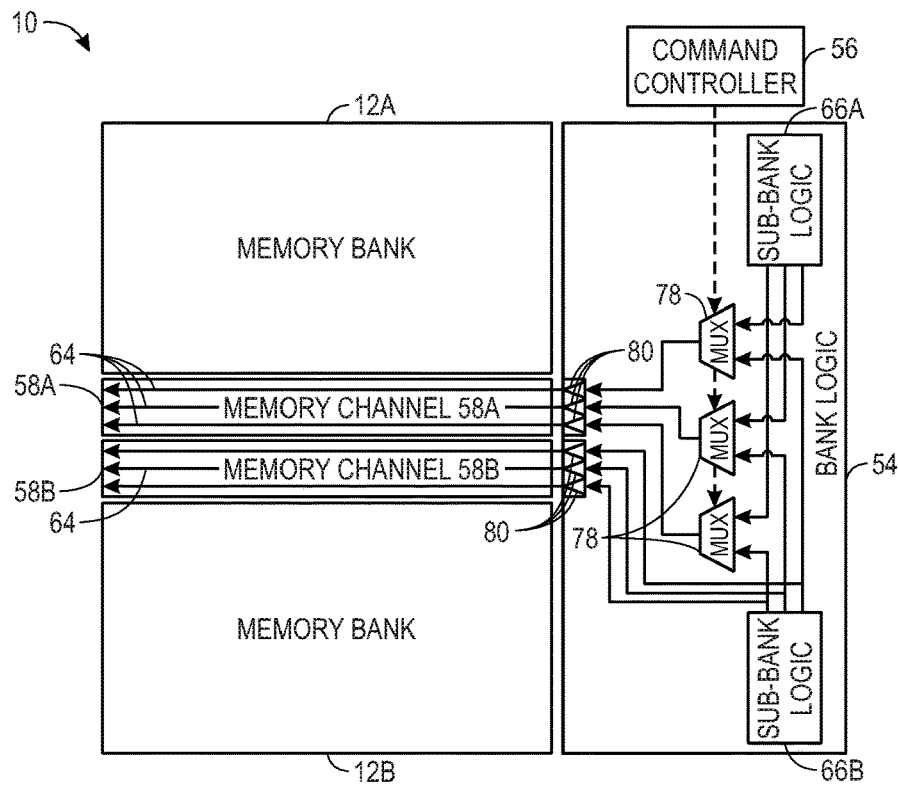
FIG. 4 is a block diagram of the pair of memory banks of FIG. 3 that include multiplexing circuitry to share refresh control signals between the pair of memory banks, in accordance with an embodiment.

FIG. 4 is a block diagram of the memory array 10 including such circuitry, for example multiplexers 78 or other suitable switching circuitry, that permit sharing refresh control signals between the one or more memory banks 12 via buffer circuitry 80. The multiplexers 78 may selectively permit the sharing of refresh control signals between the sub-bank logic circuitry 66 (66A, 66B). When the refresh control signals are shared between one or more memory banks 12, at least one of the memory banks 12 may be powered off, reducing power consumed by the system 8. The command controller 56 may control the powering off of the sub-bank logic circuitry 66, and thus an operational state of the multiplexers 78. For example, the command controller 56 may generate and transmit a control signal to the multiplexers 78 to cause the multiplexers 78 to transmit signals from the sub-bank logic circuitry 66B instead of signals from the sub-bank logic circuitry 66A.

The memory channels 58 may be considered memory channel regions of the memory array 10 that include sub-channels 64 to transmit control signals from sub-bank logic circuitry 66 and the memory banks 12. In this way, the multiplexers 78 are included external to the memory channels 58 and/or the memory channel regions of the memory array 10. The multiplexers 78 couple to inputs of the buffer circuitry 80 and thus transmit indirectly to the memory channels 58. While in a first operational state, the multiplexers 78 permit control signals from the sub-logic bank logic circuitry 66A to transmit via memory channel 58A to the memory bank 12A. However, while in a second operational state corresponding to refresh operations of the memory array 10, the multiplexers 78 do not permit control signals from the sub-logic bank logic circuitry 66A to transmit to the memory bank 12A. Instead, while in the second operational state, the multiplexers 78 transmit control signals from the sub-logic bank logic circuitry 66B to the memory bank 12A via the same memory channel 58A. Indeed, since control signals generated by the sub-logic bank logic circuitry 66B are shared between the memory banks 12 during refresh operations, the sub-logic bank logic circuitry 66A may be powered-off or have its supply power reduced while performing a memory refresh operation. In this way, the command controller 56 may generate half of the Activate Bank (ActBnk<31:0>) signals (e.g., ActBnk<0>, ActBnk<2>, ActBnk<4 . . . ActBnk<30>) to perform an equivalent refresh operations as with all of the Activate Bank (ActBnk<31:0>) signals. Since the Activate Bank signals used during the refresh operations are reduced by half, power savings may be realized at least in part by reducing power consumed by circuitry (e.g., communicative couplings) transmitting the signal (e.g., power lost to heat, power reduced in generation) and at least in part by reducing power consumed by the sub-bank logic circuitry 66 by not operating in response to the Activate Bank signals.

Figure 5:
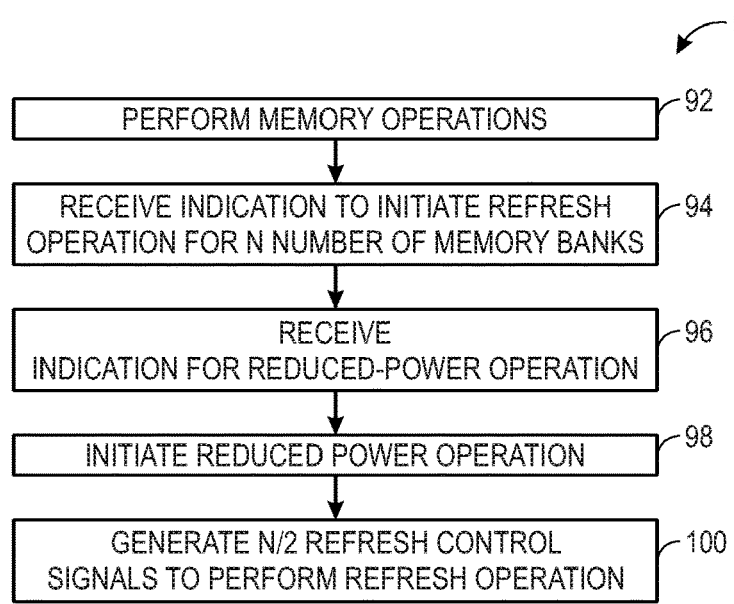
FIG. 5 is a flow diagram of a process performed by a command controller to operate the system of FIG. 1 in a reduced power mode during memory refresh operations, in accordance with an embodiment.

The operations involving the sharing of refresh control signals between the memory banks 12A, 12B are described in FIG. 5. FIG. 5 is a flow diagram of a process 90 performed by the command controller 56 to operate the system 8 in a reduced power mode during memory refresh operations. Generally, the process 90 includes a command controller performing memory operations (block 92), receiving an indication to initiate a refresh operation for an n number of memory banks (block 94), receiving an indication for a reduced-power operation (block 96), transmitting a control signal to multiplexer(s) (block 98), and generating n/2 refresh control signals to perform the refresh operation (block 100). It should be understood that although the particular operations of the process 90 are described in a particular sequence, these operations may be performed in any suitable order. Furthermore, although the process 90 is described as performed by the command controller 56, it should be understood that any suitable system and/or circuitry (e.g., circuitry in conjunction with a control system) may perform the operations described.

At block 92, the command controller 56 may perform memory operations. The memory operations may include operations associated with the command controller 56 facilitating read and/or write operations. The memory controller described in FIG. 1 may instruct the command controller 56 to perform the memory operations. The memory controller described in FIG. 1 may also instruct the command controller 56 to perform a refresh operation of the memory banks 12. Thus, at block 94, the command controller 56 may receive an indication to initiate a refresh operation for n number of memory banks 12 of a memory array 10. The command controller 56 may receive an indication of refresh operation initiation that is a command interpretable by software or processing circuitry of the command controller 56. However, in some embodiments, the command controller 56 may receive an indication from the memory controller that is interpretable by logic circuitry of the command controller 56, for example a voltage signal that is of a logic low or a logic high voltage level for the system 8 and/or memory array 10. The refresh operation may be initiated for each memory bank 12 of the memory array 10 (e.g., an n number of memory banks 12).

In addition to receiving the indication of refresh operation initiation, at block 96, the command controller 56 may receive an indication for reduced-power operation. While in a reduced-power operational mode, the memory array 10 may share refresh control signals between subsets of memory banks 12. For example, sub-bank logic circuitry 66B may generate refresh control signals for both the memory bank 12A and the memory bank 12B during the reduced-power operational mode. The portion of the sub-bank logic circuitry 66 corresponding to the portion that is not used to generate the refresh control signals may be powered-off or operated in a reduced power state. For example, in FIG. 4, the sub-bank logic circuitry 66A may be powered-off or have its supply power reduced when sharing the refresh control signals from the sub-bank logic circuitry 66B during the reduced-power operation. The indication for reduced-power operation may signal to the command controller 56 to power-off or reduce power supplied to a portion of the sub-bank logic circuitry 66 (e.g., at least sub-bank logic circuitry 66A and similarly disposed sub-bank logic circuitry 66 of other memory bank 12 pairs). It is noted that either the sub-bank logic circuitry 66A or sub-bank logic circuitry 66B may be powered-off to realize the power consumption reduction of this present disclosure. The indication for reduced-power operation may also be a command or indication interpretable by logic circuitry, software, and/or processing circuitry of the command controller 56.

At block 98, the command controller 56 may initiate a reduced-power refresh operation at least in part by transmitting a control signal to one or more multiplexers 78 and reducing power to a subset of the sub-bank logic circuitry 66. The control signal may cause the multiplexers 78 to change state to operate the memory array 10 into the reduced-power operational mode. The multiplexers 78 may change state to change permitted signal transmission from between a first portion of sub-bank logic circuitry 66 and a respective memory bank 12 to between a second portion of the sub-bank logic circuitry 66 and the respective memory bank 12. For example, the multiplexers 78 of FIG. 4, while in a first state, may transmit refresh control signals between the sub-bank logic circuitry 66A and the memory bank 12A but may transmit the refresh control signals between the sub-bank logic circuitry 66B and the memory bank 12A after receiving the control signal from the command controller 56 (e.g., at block 98). During the reduced-power refresh operation, the command controller may reduce power supplied or power-off a subset the sub-bank logic circuitry 66. For example, the sub-bank logic circuitry 66A may be operated with reduced power or no power while the sub-bank logic circuitry 66B generates refresh control signals on behalf of the sub-bank logic circuitry 66A. To reduce the power supplied to the sub-bank logic circuitry 66A, the command controller 56 may throttle or decrease a voltage supplied to one or more portions electrically coupled to the sub-bank logic circuitry 66A, electrically couple the sub-bank logic circuitry 66A to a differing power supply that supplies less power than an original power supply of the sub-bank logic circuitry 66, and/or decouple the sub-bank logic circuitry 66A from a power supply, such as via switching circuitry.

At block 100, the command controller 56 may generate a number of refresh control signals corresponding to half a number of memory banks 12 (e.g., n/2). Since the refresh control signals are shared between one or more memory banks 12 (e.g., two memory banks), half of the sub-bank logic circuitry 66 for the memory array 10 may be powered-off or have an amount of power supplied decreased. In this way, power consumed by the memory array 10, and thus the system 8, during refresh operations may be reduced. The power consumed by the memory array 10 may reduce in response to the memory array 10 using less power to generate the refresh control signals and/or in response to a subset of the sub-bank logic circuitry 66 being electrically decoupled, and therefore unable to passively consume power during refresh operations.

Figure 6:
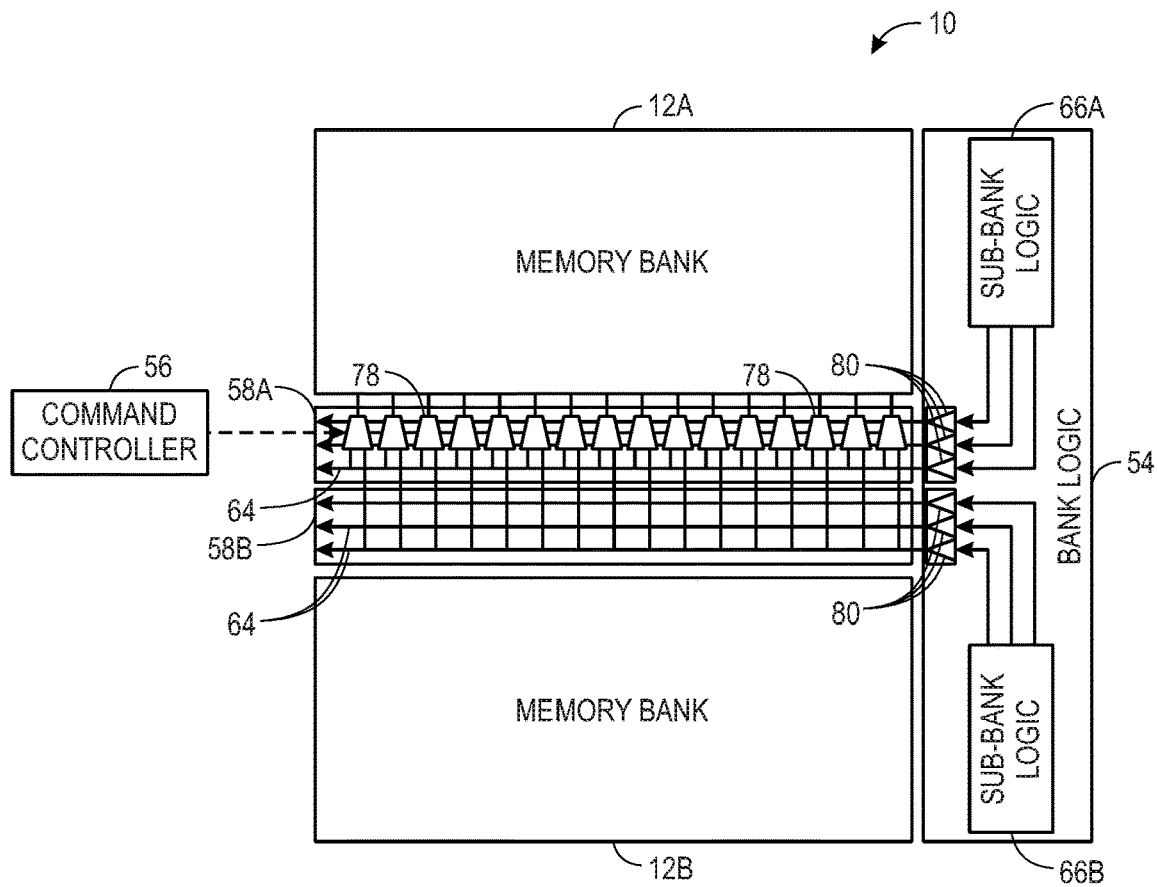
FIG. 6 is a block diagram of the pair of memory banks of FIG. 3 that include another example of multiplexing circuitry to share refresh control signals between the pair of memory banks, in accordance with an embodiment.

Although FIG. 4 depicts an example of the memory array 10 that uses circuitry to permit sharing of refresh control signals between the one or more memory banks, further reductions in power consumption may be realized. FIG. 6 is a block diagram of the memory array 10 that includes multiplexers 78 coupled to each row of each memory bank 12 to permit sharing of refresh control signals between the one or more memory banks 12. The multiplexers 78 may selectively permit the sharing of refresh control signals between the sub-bank logic circuitry 66 (66A, 66B). Similar to the example memory array 10 of FIG. 4, when the refresh control signals are shared between one or more memory banks 12, at least one of the memory banks 12 may be powered-off, reducing power consumed by the system 8. The command controller 56 may control the powering-off of the sub-bank logic circuitry 66, and thus an operational state of the multiplexers 78. For example, the command controller 56 may generate and transmit a control signal to the multiplexers 78 to cause the multiplexers 78 to transmit signals from the sub-bank logic circuitry 66B instead of signals from the sub-bank logic circuitry 66A.

However, unlike the example memory array 10 of FIG. 4, the multiplexers 78 couple the memory bank 12A to the sub-channel 64 shared with the memory bank 12B. The multiplexers 78 in this case are included within the memory channel region of the memory array 10 and couple directly to the memory channels 58B (e.g., via a direct coupling). As used herein, to "couple directly" or "a direct coupling" may refer to a physically connection between two components that is made without intervening components. The memory array 10 of FIG. 4 may remove or reduce power supplied to the sub-bank logic circuitry 66A but may continue to transmit refresh control signals via one or more sub-channels 64 through buffer circuitry 80. The memory array 10 of FIG. 6 may remove or reduce power supplied to the sub-bank logic circuitry 66A and reduce power consumed via the sub-channels 64 by using fewer of the sub-channels 64 to transmit the refresh control signals to the memory bank 12A. Since the memory channels 58B are shared with the memory bank 12A to deliver same refresh control signals to both memory bank 12A and memory bank 12B, the memory channel 58A may not be used in the memory refresh operations. Thus, the memory channel 58A may not consume power when transmitting refresh control signals. Similar to descriptions of FIG. 4 and FIG. 5, the command controller 56 may generate and transmit control signals to operate the memory array 10 into a reduced-power refresh operation that generally includes powering off a subset of the sub-bank logic circuitry 66 (e.g., at least sub-bank logic circuitry 66A), changing a state of the multiplexers 78 to permit signal transmission between the sub-channel 64 of the memory channel 58B and the memory bank 12A. It is noted that either the sub-bank logic circuitry 66A or sub-bank logic circuitry 66B may be powered-off to realize the power consumption reduction of this present disclosure.

Keeping the foregoing in mind, in some embodiments, the memory channels 58 transmit additional control signals to the refresh control signal. In these cases, the additional control signals may be generated at a subset of the sub-bank logic circuitry 66 and transmitted to the remaining sub-bank logic circuitry 66. The additional control signals may include a refresh address, word line control signals, sense amplifier control signals, or the like which may be multiplexed in to the memory bank 12A via multiplexers 78 to help operate the memory array 10 to perform the memory refresh operations when the memory bank 12A is operated in the reduced-power refresh operation. It is noted that in this disclosure a variety of logic gates are discussed, however it should be understood that the depicted logic gates may each be replaced with used in combination with a variety of valid logic gates, including not-and (NAND) gates, not-or (NOR) gates, exclusive-or (XOR) gates, AND gates, OR gates, inverting gates, or the like (even if not explicitly called out herein).

Accordingly, the technical effects of the present disclosure include systems and methods that improve memory refresh operations. Using multiplexing circuitry described above, at least two memory banks may undergo a memory refresh operation using shared refresh control signals. The sharing of refresh control signals may permit one or more sub-bank logic circuitries to be powered off, thereby decreasing power consumed during refresh operations. Furthermore, additional power consumption improvements may be realized by disposing the multiplexing circuitry between a first memory array and sub-channel circuitry for a second memory array such that at least a portion of a memory channel corresponding to the first memory array may be bypassed.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function]. . . " or "step for [perform]ing [a function]. . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a plurality of memory banks comprising a first memory bank and a second memory bank, wherein each memory bank comprises a plurality of memory circuitries and is configured to store information; and
first sub-bank logic circuitry communicatively coupled to the first memory bank and the second memory bank via a plurality of multiplexers, wherein the first sub-bank logic circuitry is configured to couple to the first memory bank via the plurality of multiplexers and via a plurality of couplings that bypass the plurality of multiplexers, and wherein the first sub-bank logic circuitry transmits a control signal to refresh the second memory bank and the first memory bank when the plurality of multiplexers is operated to permit sharing of the control signal between the first memory bank and the second memory bank.

2. The device of claim 1, wherein the control signal is shared with a first row of the first memory bank at the same time as when the control signal is shared with a first row of the second memory bank, wherein the first row of the first memory bank corresponds to a same row position as the first row of the second memory bank.

3. The device of claim 1, wherein a respective multiplexer of the plurality of multiplexers is configured to couple to a memory channel via a buffer circuit.

4. The device of claim 3, wherein the multiplexer is disposed external to the memory channel, and wherein the buffer circuit is disposed between the multiplexer and the memory channel.

5. The device of claim 1, wherein the plurality of multiplexers is configured to directly couple to a plurality of memory channels.

6. The device of claim 5, wherein the plurality of multiplexers is disposed internal to the plurality of memory channels, and wherein a buffer circuit couples the plurality of memory channels directly to the first sub-bank logic circuitry.

7. The device of claim 1, wherein the control signal is transmitted from the first sub-bank logic circuitry in response to initiated refresh operations, and wherein the control signal is one of a plurality refresh control signals used to refresh individual rows of the first memory bank at least partially simultaneous to rows of the second memory bank.

8. The device of claim 7, wherein the first memory bank is coupled to a second sub-bank logic circuitry, and wherein the second sub-bank logic circuitry is operated in a reduced-power operational mode during the refresh operations.

9. The device of claim 8, wherein the reduced-power operational mode comprises removing power from the second sub-bank logic circuitry.

10. The device of claim 1, comprising second sub-bank logic circuitry configured to be powered-off while the second memory bank is refreshed.

11. A method, comprising:
performing, via a first bank logic circuitry, a memory operation;
receiving, via the first bank logic circuitry, an indication to initiate a refresh operation;
receiving, via the first bank logic circuitry, an indication to operate in a reduced-power operation;
transmitting, via the first bank logic circuitry, a refresh control signal to buffer circuitry coupled to a multiplexer to initiate a reduced-power refresh operation, wherein the multiplexer is coupled between the first bank logic circuitry, a second bank logic circuitry, and a memory bank, wherein the reduced-power refresh operation enables power supplied to the second bank logic circuitry to be reduced while a refresh of the memory bank occurs.

12. The method of claim 11, comprising transmitting a plurality of refresh control signals comprising the refresh control signal, and wherein an amount of the plurality of refresh control signals is equal to half an amount of a plurality of memory banks comprising the memory bank.

13. The method of claim 11, comprising removing the second bank logic circuitry from its power supply.

14. The method of claim 11, comprising transmitting a plurality of operational control signals to a plurality of multiplexers to change a state of each of the plurality of multiplexers such that signals are able to be shared between the first bank logic circuitry and the memory bank without sharing signals from the second bank logic circuitry, wherein the plurality of multiplexers comprises the multiplexer.

15. A system, comprising:
a memory controller; and
a memory module communicatively coupled to the memory controller, wherein the memory module comprises:
first bank logic circuitry coupled to a first memory bank;
second bank logic circuitry configured to be coupled to a second memory bank and powered-off while the second memory bank is refreshed; and
a switching circuit configured to couple the first bank logic circuitry to the second memory bank instead of the second bank logic circuitry during memory refresh operations in response to a control signal from the memory controller.

16. The system of claim 15, wherein the memory module comprises a memory channel region used to transmit one or more control signals between the first memory bank and the first bank logic circuitry.

17. The system of claim 16, wherein the switching circuit is disposed within the memory channel region.

18. The system of claim 16, wherein the switching circuit is disposed external to the memory channel region and coupled between a buffer and the first bank logic circuitry.

19. The system of claim 15, wherein the memory controller is configured to power-off the second bank logic circuitry at least in part by:
transmitting a first indication to cause the first bank logic circuitry to initiate a refresh operation associated with the memory module;
transmitting a second indication to cause the second bank logic circuitry to be removed from power; and
transmitting a refresh control signal to the first bank logic circuitry, wherein the first bank logic circuitry transmits the refresh control signal onto the memory.

20. The system of claim 15, wherein the switching circuit is coupled to a first communicative coupling that routes between the first bank logic circuitry and the first memory bank and a second communicative coupling that routes between the second bank logic circuitry and the second memory bank.

* * * * *